US00RE49683E

(19) United States
(12) Reissued Patent
Shin et al.

(10) Patent Number: US RE49,683 E
(45) Date of Reissued Patent: *Oct. 3, 2023

(54) MEMORY CONTROLLER, STORAGE DEVICE AND METHOD FOR ADJUSTING A DATA INPUT/OUTPUT SPEED OF THE CONTROLLER BASED ON INTERNAL AND EXTERNAL TEMPERATURE INFORMATION

(71) Applicant: SK hynix Inc., Gyeonggi-do (KR)

(72) Inventors: Soong Sun Shin, Gyeonggi-do (KR); Sang Hyun Kim, Gyeonggi-do (KR)

(73) Assignee: SK hynix Inc., Gyeonggi-do (KR)

( * ) Notice: This patent is subject to a terminal disclaimer.

(21) Appl. No.: 16/837,340

(22) Filed: Apr. 1, 2020

Related U.S. Patent Documents

Reissue of:
(64) Patent No.: 10,282,271
Issued: May 7, 2019
Appl. No.: 15/838,513
Filed: Dec. 12, 2017

(30) Foreign Application Priority Data

May 30, 2017 (KR) ..... 10-2017-0067027

(51) Int. Cl.
*G11C 16/06* (2006.01)
*G06F 3/06* (2006.01)
(Continued)

(52) U.S. Cl.
CPC ..... *G06F 11/3058* (2013.01); *G06F 1/206* (2013.01); *G06F 3/0604* (2013.01);
(Continued)

(58) Field of Classification Search
CPC .. G06F 11/3058; G06F 1/206; G06F 12/0806; G06F 3/0611; G06F 3/0659;
(Continued)

(56) References Cited

U.S. PATENT DOCUMENTS 7,339,842 B1 3/2008 Hold
7,356,426 B2 * 4/2008 Jain ..... G01K 3/005 327/378
(Continued)

FOREIGN PATENT DOCUMENTS

CN 101587745 A 11/2009
CN 104571216 A 4/2015
(Continued)

OTHER PUBLICATIONS

Office Action dated Mar. 8, 2021, KR 10-2017-0067027.
(Continued)

*Primary Examiner* — B. James Peikari
(74) *Attorney, Agent, or Firm* — Weaver Austin Villeneuve & Sampson LLP

(57) ABSTRACT

Provided herein may be a storage device and a method of operating the same. In a storage device for controlling operational performance depending on temperature, a memory controller configured to control a memory device may include an internal temperature sensing unit configured to generate an internal temperature information by sensing a temperature of the memory controller and a performance adjustment unit configured to receive an external temperature information from an external temperature sensing unit, and controlling operational performance of the memory controller using the internal temperature information and the external temperature information, wherein the external temperature information represents a temperature of the memory device.

17 Claims, 11 Drawing Sheets

(Amended)

(51) Int. Cl.

| | |
|---|---|
| ***G06F 11/30*** | (2006.01) |
| ***G06F 1/20*** | (2006.01) |
| ***G06F 12/02*** | (2006.01) |
| ***G06F 12/0806*** | (2016.01) |
| ***G06F 12/0868*** | (2016.01) |
| ***G06F 12/10*** | (2016.01) |
| ***G11C 7/04*** | (2006.01) |
| ***G11C 11/56*** | (2006.01) |
| ***G11C 16/34*** | (2006.01) |
| ***G11C 16/20*** | (2006.01) |
| *G11C 7/10* | (2006.01) |

(52) U.S. Cl.
CPC ..... *G06F 3/0611* (2013.01); *G06F 3/0614* (2013.01); *G06F 3/0653* (2013.01); *G06F 3/0659* (2013.01); *G06F 3/0679* (2013.01); *G06F 11/3037* (2013.01); *G06F 12/0246* (2013.01); *G06F 12/0806* (2013.01); *G06F 12/0868* (2013.01); *G06F 12/10* (2013.01); *G11C 7/04* (2013.01); *G11C 11/5621* (2013.01); *G11C 16/20* (2013.01); *G11C 16/3418* (2013.01); *G06F 2212/657* (2013.01); *G11C 7/1063* (2013.01)

(58) Field of Classification Search
CPC .... G06F 11/3037; G06F 12/10; G06F 3/0653; G06F 3/0604; G06F 12/0868; G06F 12/0246; G06F 3/0614; G06F 3/0679; G06F 2212/657; G11C 7/04; G11C 16/3418; G11C 11/5621; G11C 16/20; G11C 7/1063
See application file for complete search history.

(56) References Cited

U.S. PATENT DOCUMENTS

| | | | | |
|---|---|---|---|---|
| 8,140,293 | B2 * | 3/2012 | Jeong | G01K 7/425 702/130 |
| 8,472,274 | B2 * | 6/2013 | Fai | G11C 11/5642 365/185.09 |
| 9,013,932 | B1 * | 4/2015 | Lee | G11C 7/04 365/189.09 |
| 10,282,271 | B2 | 5/2019 | Shin et al. | |
| 2004/0057325 | A1 * | 3/2004 | Menczigar | G11C 7/04 365/232 |
| 2005/0197795 | A1 * | 9/2005 | Aas | G01R 35/005 702/107 |
| 2006/0066384 | A1 * | 3/2006 | Jain | G01K 3/005 327/378 |
| 2007/0019489 | A1 * | 1/2007 | Herbert | G11C 7/225 365/211 |
| 2008/0106321 | A1 * | 5/2008 | Jeong | G11C 11/406 327/512 |
| 2008/0297228 | A1 * | 12/2008 | Kim | G01K 7/01 327/512 |
| 2009/0052266 | A1 * | 2/2009 | Askar | G06F 13/161 365/212 |
| 2009/0052268 | A1 * | 2/2009 | Janzen | G01K 7/00 365/230.02 |
| 2012/0224425 | A1 * | 9/2012 | Fai | G11C 11/5642 365/185.09 |
| 2014/0192583 | A1 * | 7/2014 | Rajan | G11C 7/10 365/63 |
| 2015/0048877 | A1 | 2/2015 | Shen et al. | |
| 2015/0301744 | A1 * | 10/2015 | Kim | G06F 3/0679 711/103 |
| 2016/0064063 | A1 * | 3/2016 | Nomura | G11C 11/40618 365/51 |
| 2018/0349243 | A1 | 12/2018 | Shin et al. | |

FOREIGN PATENT DOCUMENTS

| | | | |
|---|---|---|---|
| CN | 104637524 | A | 5/2015 |
| CN | 105047216 | A | 11/2015 |
| CN | 108986852 | B | 3/2022 |
| KR | 10-2012-0034828 | | 4/2012 |
| KR | 10-2015-0052631 | | 5/2015 |
| KR | 10-2015-0120213 | | 10/2015 |
| KR | 1020160137180 | | 11/2016 |
| KR | 1020180130872 | | 12/2018 |

OTHER PUBLICATIONS

Non-Final Office Action for U.S. Appl. No. 15/838,513, dated Sep. 10, 2018, 27 pages.

Notice of Allowance for U.S. Appl. No. 15/838,513, dated Dec. 28, 2018, 8 pages.

CN Office Action dated Sep. 30, 2021 in Application No. CN201711353193.9 [with English translation].

U.S. Non-Final Office Action dated Jul. 7, 2022 in U.S. Appl. No. 16/905,443 .

* cited by examiner

FIG. 2
(Amended)
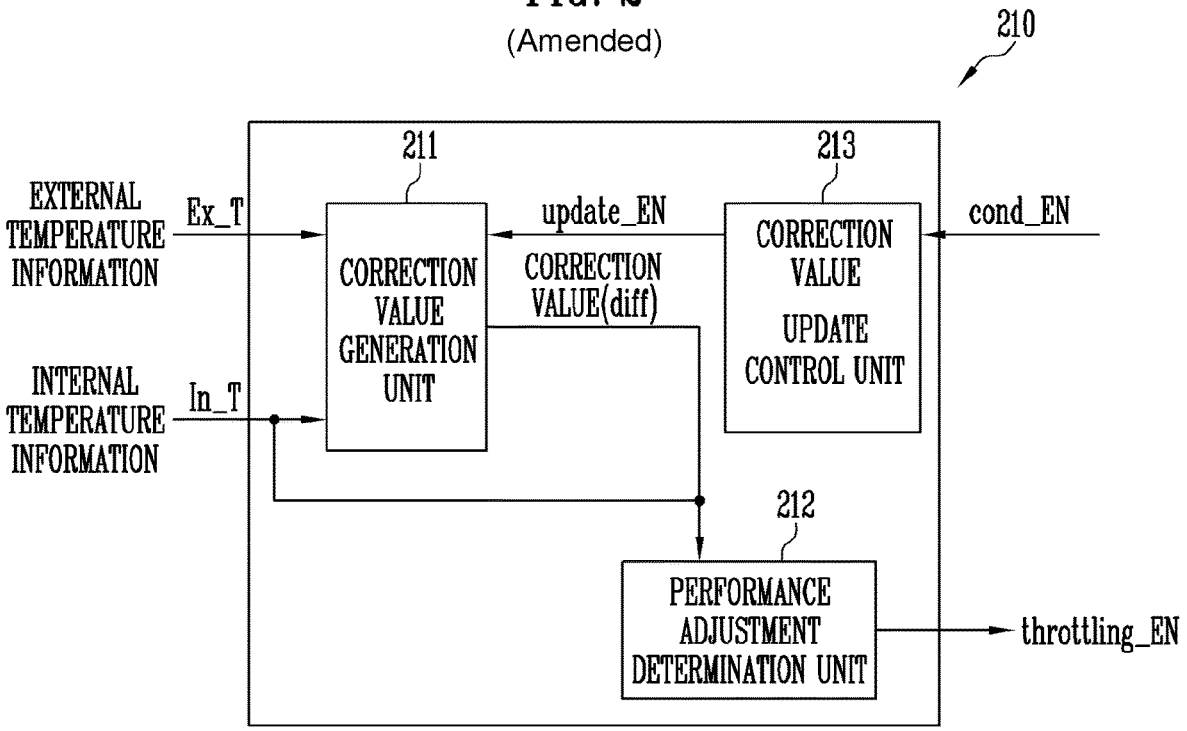

FIG. 6
(Amended)
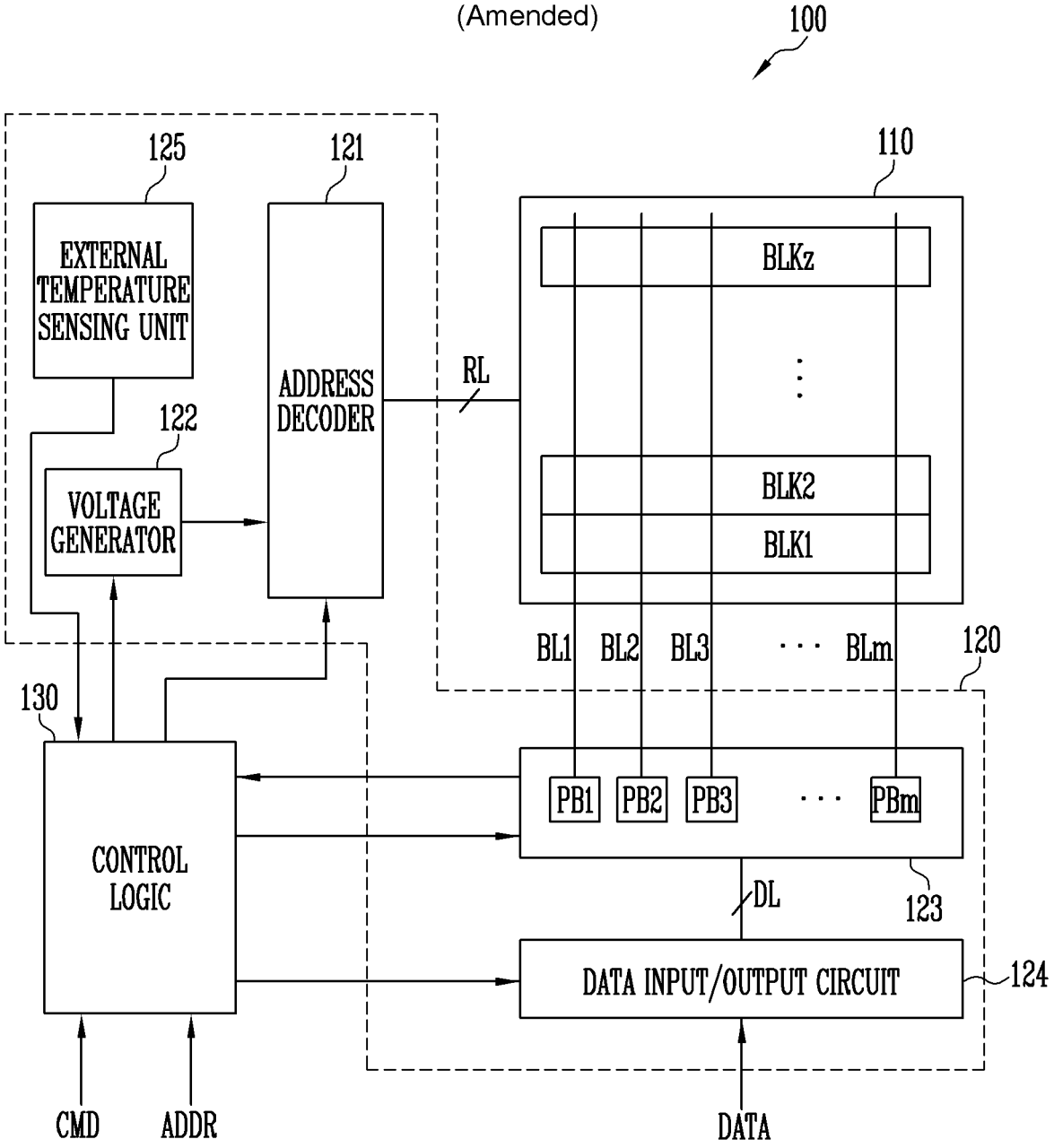

FIG. 7
(Amended)
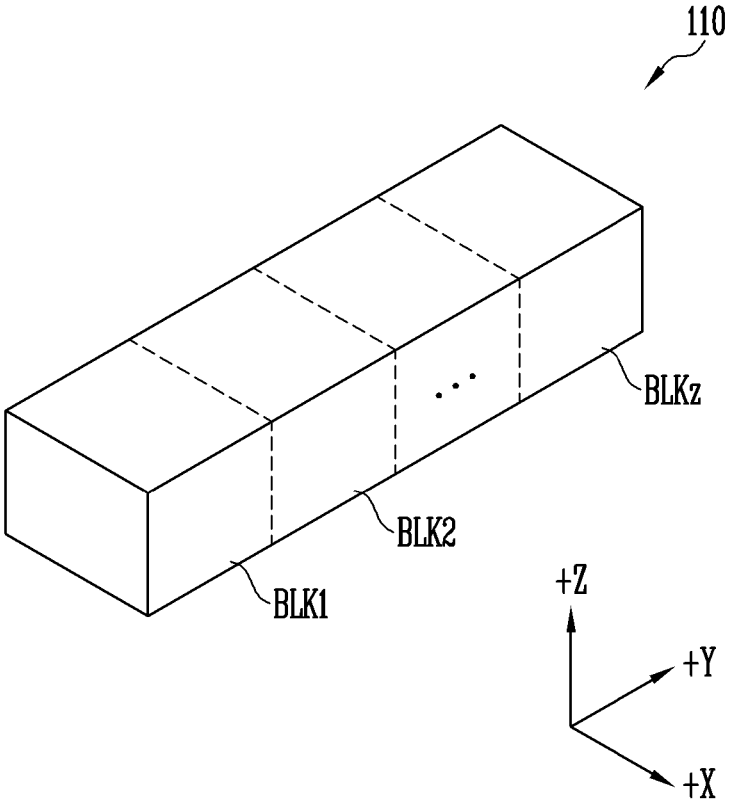

FIG. 8
(Amended)
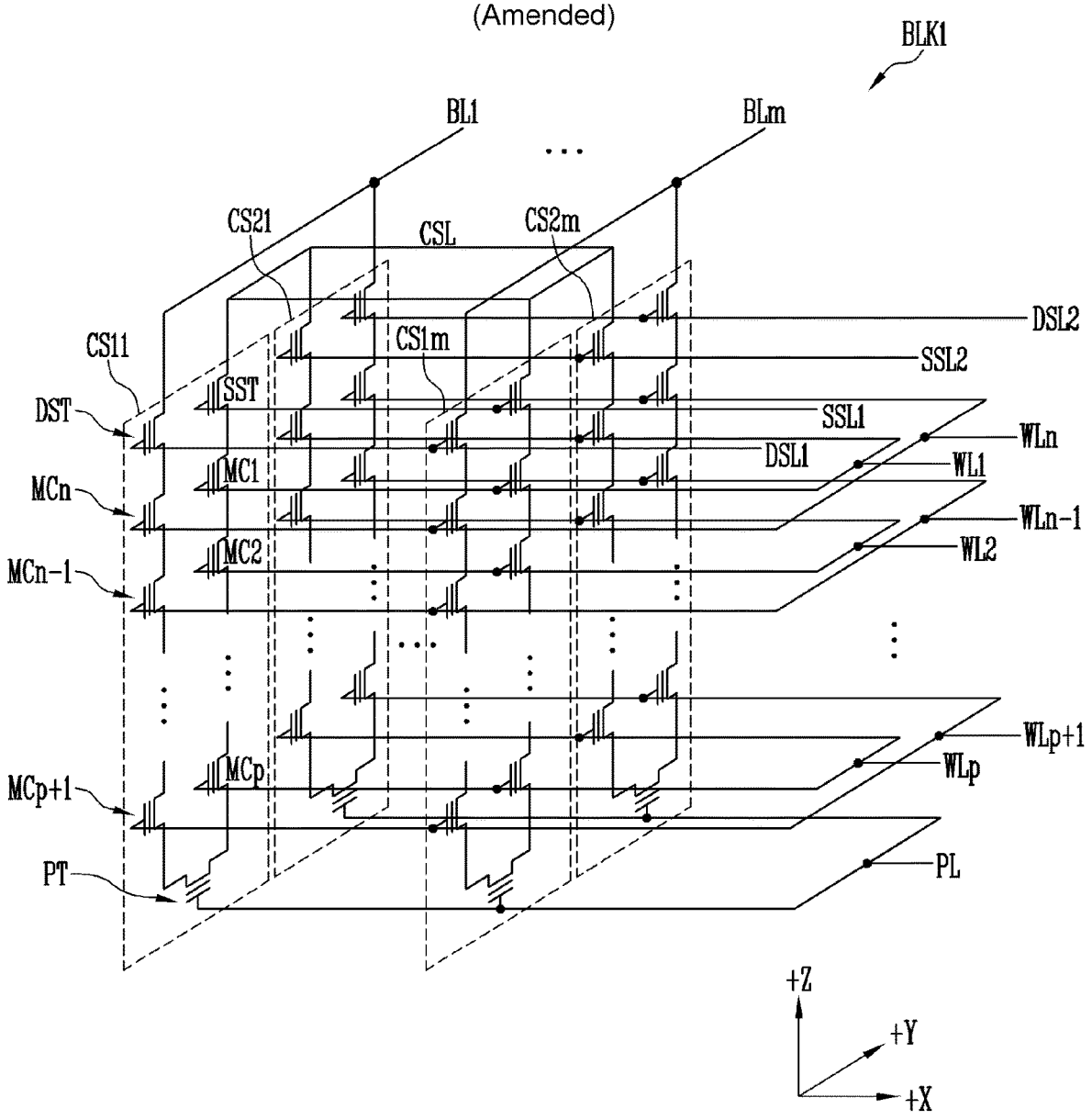

FIG. 9
(Amended)
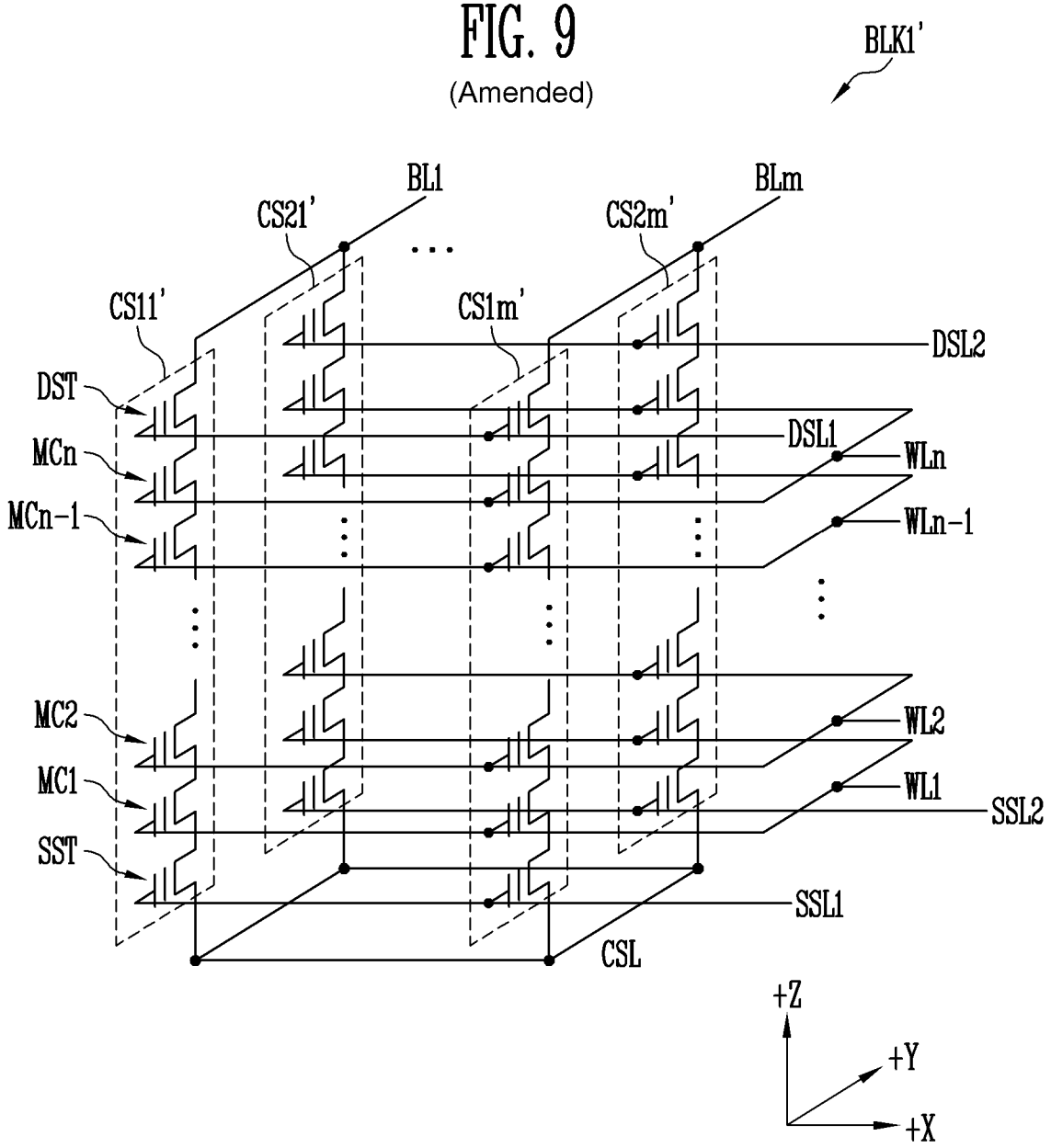

FIG. 10
(Amended)
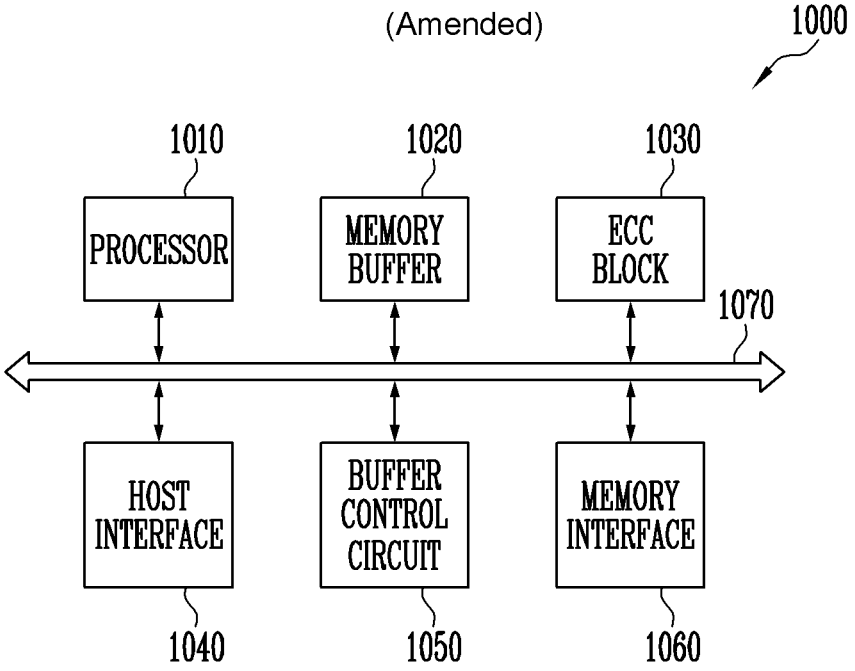
FIG. 11
(Amended)
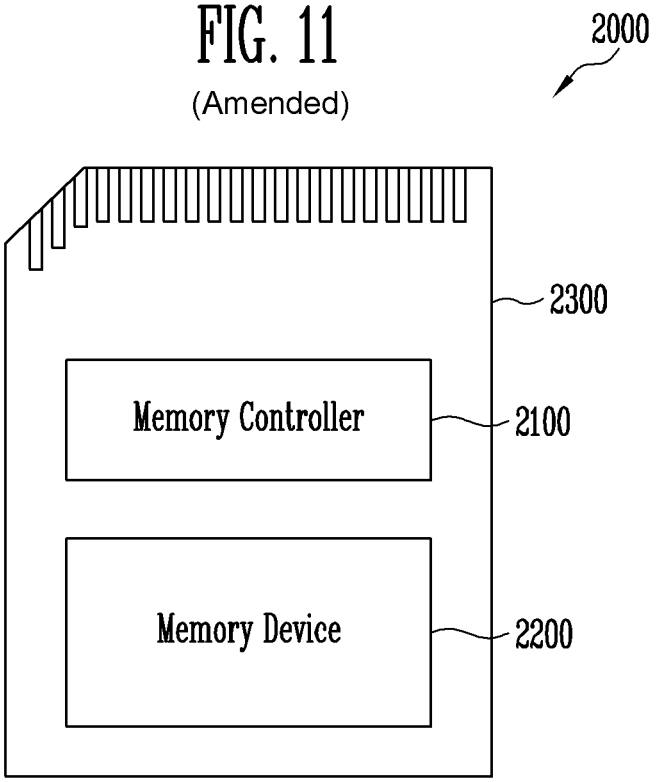

FIG. 12
(Amended)
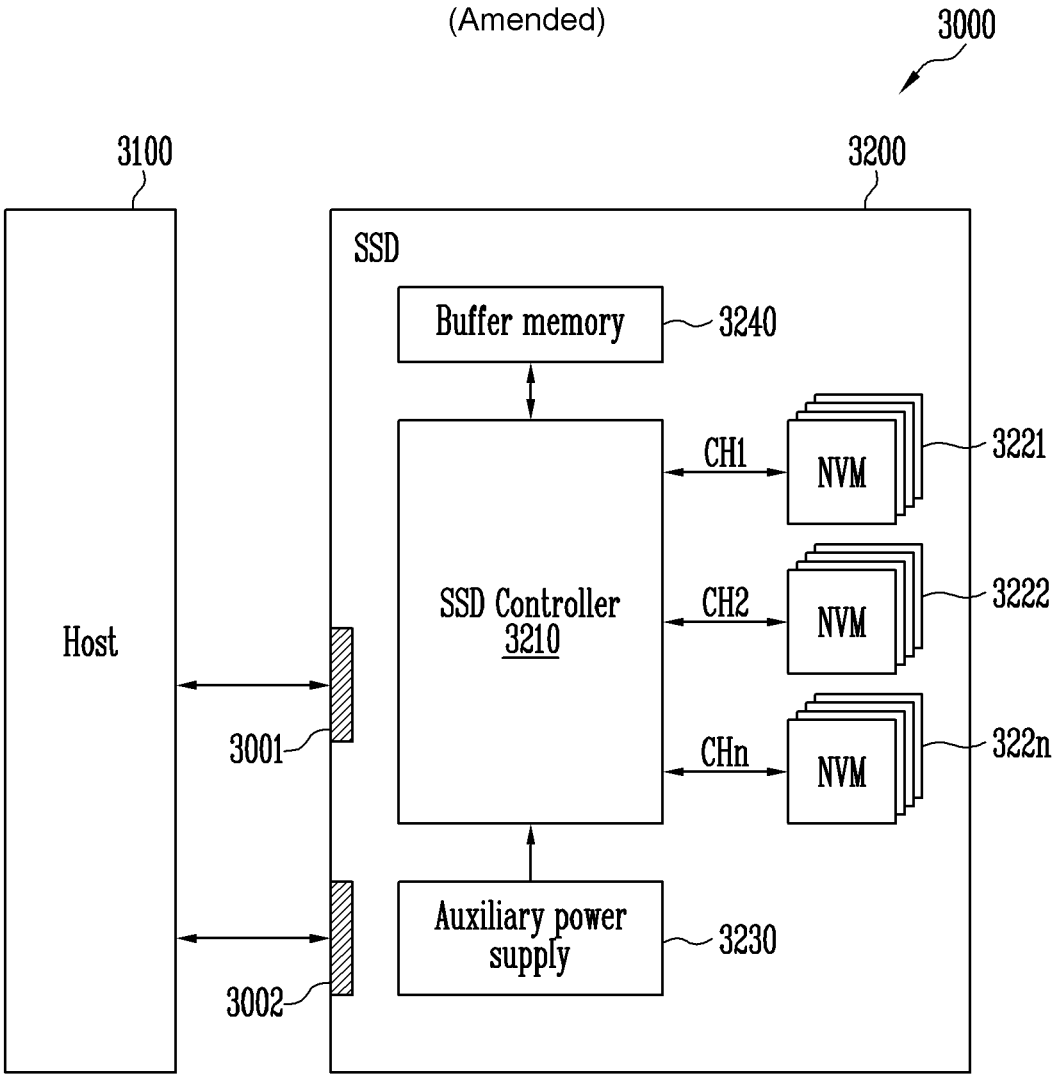

FIG. 13
(Amended)
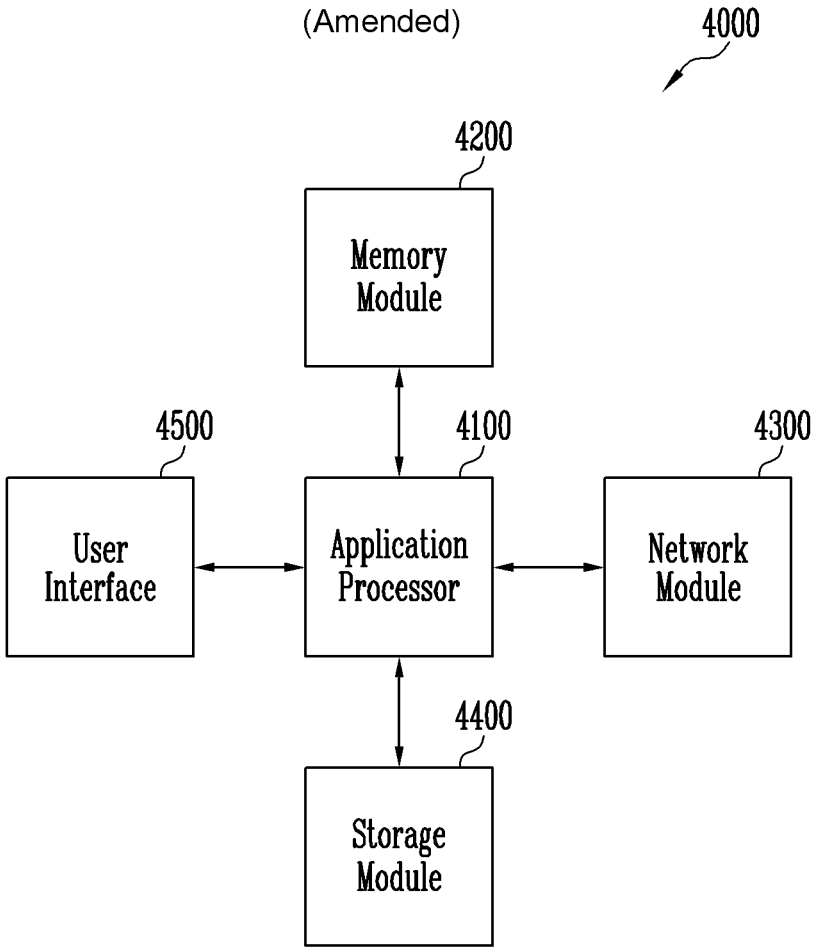

MEMORY CONTROLLER, STORAGE DEVICE AND METHOD FOR ADJUSTING A DATA INPUT/OUTPUT SPEED OF THE CONTROLLER BASED ON INTERNAL AND EXTERNAL TEMPERATURE INFORMATION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

The present application *is an application for reissue of U.S. Pat. No. 10,282,271 issued May 7, 2019 on U.S. Non-Provisional patent application Ser. No. 15/838,513 filed Dec. 12, 2017, and which* claims priority under 35 U.S.C. § 119(a) to Korean patent application number 10-2017-0067027 filed on May 30, 2017, the entire disclosure of which is incorporated herein by reference.

BACKGROUND

Field of Invention

Various embodiments of the present disclosure generally relate to an electronic device and, more particularly, to a storage device and a method of operating the storage device.

Description of Related Art

A storage device is a device for storing data under the control of a host device, such as a computer, a smart phone, or a smart pad. Examples of the storage device include a device for storing data in a magnetic disk, as in the case of a hard disk drive (HDD), and a device for storing data in a semiconductor memory, especially in a nonvolatile memory, as in the case of a solid state drive (SSD) or a memory card.

Representative examples of the nonvolatile memory include a read-only memory (ROM), a programmable ROM (PROM), an electrically programmable ROM (EPROM) an electrically erasable and programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a storage device capable of adjusting the performance thereof depending on temperature, and a method of operating the same.

An embodiment of the present disclosure may provide for a memory controller for controlling a memory device. The memory controller may include an internal temperature sensing unit configured to generate an internal temperature information by sensing a temperature of the memory controller and a performance adjustment unit configured to receive an external temperature information from an external temperature sensing unit, and controlling operational performance of the memory controller using the internal temperature information and the external temperature information, wherein the external temperature information represents a temperature of the memory device.

An embodiment of the present disclosure may provide for a storage device. The storage device may include a plurality of memory devices, an external temperature sensing unit configured to generate an external temperature information by sensing a temperature of the respective memory device and a memory controller configured to: control the plurality of memory devices, and control operational performance of the memory controller using internal temperature information and the external temperature information, wherein the internal temperature information represents a temperature of the memory controller.

An embodiment of the present disclosure may provide for a method of operating a storage device, the storage device including a plurality of memory devices and a memory controller for controlling the memory devices. The method may include, obtaining, when a write request for the plurality of memory devices is inputted, internal temperature information representing a temperature of the memory controller; generating, when the storage device boots, a correction value based on the internal temperature information and an external temperature information representing a temperature of the respective memory devices; generating adjusted temperature information by applying the correction value to the internal temperature information; and adjusting operational performance of the memory controller using the adjusted temperature information and pre-stored critical temperature information.

BRIEF DESCRIPTION OF THE DRAWINGS

FIG. 2 is a block diagram illustrating an exemplary configuration of a performance adjustment unit shown in FIG. 1.

FIG. 6 is a diagram illustrating an exemplary configuration of a memory device shown in FIG. 1.

FIG. 7 is a diagram illustrating an exemplary embodiment of a memory cell array shown in FIG. 6.

FIG. 8 is an exemplary circuit diagram illustrating one of memory blocks shown in FIG. 7.

FIG. 9 is an exemplary circuit diagram illustrating one of the memory blocks shown in FIG. 7.

FIG. 10 is a diagram illustrating an exemplary configuration of the memory controller shown in FIG. 1.

FIG. 11 is a block diagram illustrating a memory card system to which the storage device in accordance with an embodiment of the present disclosure is applied.

FIG. 12 is a block diagram illustrating an example of a solid state drive (SSD) system to which the storage device in accordance with an embodiment of the present disclosure is applied.

FIG. 13 is a block diagram illustrating a user system to which the storage device in accordance with an embodiment of the present disclosure is applied.

DETAILED DESCRIPTION

Figure 1:
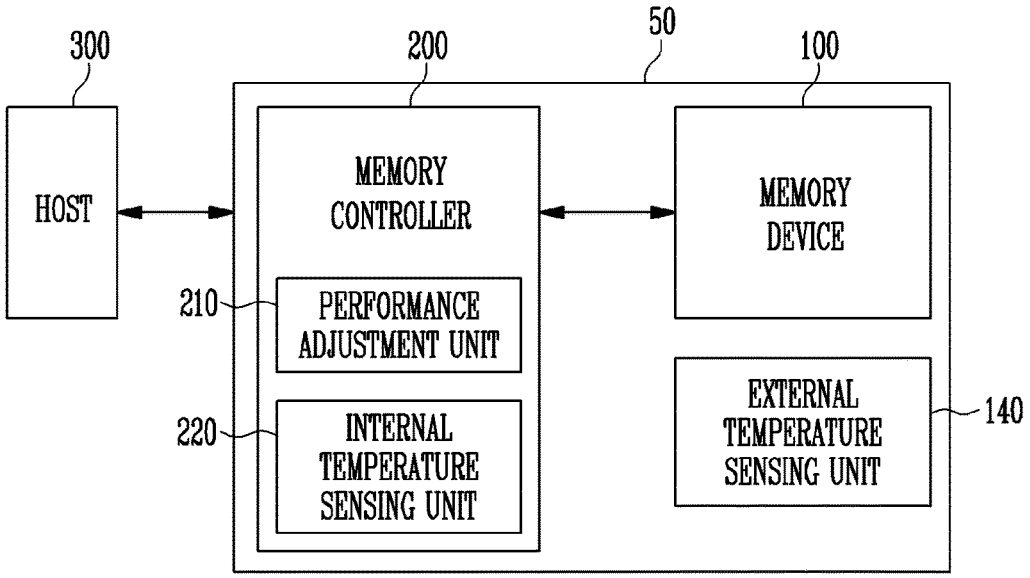
FIG. 1 is a diagram illustrating a storage device according to an embodiment of the present disclosure.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned otherwise. Furthermore, "include/comprise" or "including/comprising" used in the specification represent that one or snore components, steps operations, and elements may exist or be added.

Furthermore, unless defined otherwise all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, embodiments of the present disclosure will be described with reference to the attached drawings to fully describe the present disclosure to a person having ordinary knowledge in the art to which the present disclosure pertains.

FIG. 1 is a diagram illustrating a storage device according to an embodiment of the present disclosure.

Referring to FIG. 1, a storage device 50 may include a memory device 100, a memory controller 200, and an external temperature sensing unit 140.

The memory device 100 may store data. The memory device 100 is operated under the control of the memory controller 200. The memory device 100 may include a memory cell array including a plurality of memory cells in which data is stored. Examples of suitable memory devices 100 include a Double Data Rate Synchronous Dynamic Random Access Memory (DDR SDRAM), a Low Power Double Data Rate4 (LPDDR4) SDRAM, a Graphics Double Data Rate (DDDR) SDRAM a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM) a ferroelectric random access memory (FRAM), or a spin transfer torque random access memory (STT-RAM). In an embodiment, the memory device 100 may be implemented as a three-dimensional (3D) array structure. The present disclosure may also be applied not only to a flash memory in which a charge storage layer is implemented as a conductive floating, gate (FG), but also to a charge trap flash (CTF) memory in which a charge storage layer is implemented as an insulating layer.

In operation, the memory device 100 may receive a command and an address from the memory controller 200, and access a region, selected in response to the address, in the memory cell array. That is, the memory device 100 may perform an operation corresponding to the command on the region selected in response to the address. For example, the memory device 100 may perform a program operation, a read operation, and an erase operation. During a program operation, the memory device 100 may program data in the region selected in response to the address. During a read operation, the memory device 100 may read data from the region selected in response to the address. During an erase operation, the memory device 100 may erase data stored in the region selected in response to the address.

The external temperature sensing unit 140 may sense the temperature of the memory device 100. In FIG. 1, the external temperature sensing unit 140 is provided as a separate unit from the memory device 100 and the memory controller 200 in the storage device 50 implemented as a semiconductor package. The location of the external temperature sensing unit 140 may be determined in consideration that the temperature of the memory device 100 is determined based on external temperature information that is an output value of the external temperature sensing unit 140. In an embodiment, the external temperature sensing unit 140 may be located adjacent to a component that is more or most sensitive to temperature-based control among the components of the memory device 100. For example, the external temperature sensing unit 140 may be arranged either on or adjacent to the surface of any one of the memory controller 200 and the memory device 100.

In an embodiment, the external temperature sensing unit 140 may be included in the memory device 100 although not illustrated. In this case, the temperature sensing result by the external temperature sensing unit 140 may be provided through a communication interface between the memory controller 200 and the memory device 100.

The external temperature sensing unit 140 may include at least one sensor for detecting a temperature information. The external temperature sensing unit 140 may include, for example a temperature sensor for detecting temperature. In an embodiment, the external temperature sensing unit 140 may include a plurality of temperature sensors located at different locations of the memory device.

Examples of suitable temperature sensors include a resistance temperature detector (RTD) and a thermistor. However, other type temperature sensors may also be used. The RTD may be a temperature sensor that uses a metal material having high variation in resistance depending on the temperature, for example, platinum (Pt), and detects the temperature by measuring the variation in the resistance of the metal material. The thermistor may be a semiconductor element obtained by mixing and sintering oxides such as manganese, nickel, copper, cobalt, chrome, and iron oxides. A thermistor has the characteristic that variation in its resistance is large for small temperature changes, hence, it can detect small temperature differences. A thermistor may be manufactured and used in various forms. As an example of a thermistor, is a thermistor manufactured in the form of a chip in which electrodes are formed on both sides of the thermistor.

The memory controller 200 may control the operation of the memory device 100 in response to a request from a host 300 or regardless of the request from the host 300.

For example, the memory controller 200 may control the memory device 100 so that a program operation, a read operation or an erase operation is performed in response to a request received from the host 300. During a program operation, the memory controller 200 may provide a program command, an address, and data to the memory device 100. During a read operation, the memory controller 200 may provide a read command and an address to the memory device 100. During an erase operation, the memory controller 200 may provide an erase command and an address to the memory device 100.

In an embodiment, the memory controller 200 may autonomously generate a program command, an address, and data without receiving a request from the host, and transmit them to the memory device 100. For example, the memory controller 200 may provide commands, addresses, and data to the memory device 100 to perform background operations, such as a program operation for wear leveling and a program operation for garbage collection.

The memory controller 200 may further include a performance adjustment unit 210 and an internal temperature sensing unit 220.

The performance adjustment unit 210 may adjust the performance of the storage device 50 depending on the temperature of the memory device 100. For example, the performance adjustment unit 210 may reduce the operational performance of the storage device 50 in order to decrease the temperature of the memory device 100 when the temperature of the memory device 100 exceeds a critical temperature. An operation for limiting operational performance of the storage device 50 depending on the temperature of the memory device 100 is referred to as a throttling operation.

In an embodiment, the throttling operation may be an operation of controlling the data input/output speeds of the memory controller 200 and the memory device 100. For example, when the temperature of the memory device 100 is higher than a critical temperature, the memory controller 200 may decrease the data input/output speed thereof. The data input/output speed may be adjusted by controlling the number of data input/output channels, the number of ways, or a time (e.g., tPROG or tREAD) required for a data write operation or a data read operation. Alternatively, the data input/output speed may be controlled by temporarily holding the transmission of commands, addresses, and data for performing a data write operation or a data read operation. Alternatively, the data input/output speed may be controlled by transmitting commands, addresses, and data for performing a data write operation or a data read operation to the memory device 100 after a delay corresponding to a predetermined time has passed.

In an embodiment, the memory controller 200 may control a plurality of memory devices 100. In this case, the throttling operation may be an operation of controlling the number of memory devices 100 that are simultaneously accessed by the memory controller 200. For example, the memory controller 200 may decrease the number of memory devices 100 that are simultaneously accessed if the temperature of each memory device 100 is higher than a critical temperature.

In an embodiment, the throttling operation may be an operation of lowering the frequency of a timing signal or a clock signal that is inputted to the memory device 100 below a basic frequency. For example, the memory controller 200 may decrease the frequency of the timing signal or the clock signal that is inputted to the memory device 100 to the frequency lower than the basic frequency when the temperature of the memory device 100 is higher than the critical temperature.

In an embodiment, the throttling operation may be an operation of activating a cooler included in the storage device 50. For example the memory controller 200 may activate the cooler when the temperature of the memory device 100 is higher than the critical temperature.

In addition to the above-described throttling operations, any operation of allowing the memory controller 200 to limit operational performance to decrease the temperature of the memory device 100 falls within the category of the throttling operation according to an embodiment of the present disclosure, and are not limited to the operations described in the present specification.

The internal temperature sensing unit 220 may be included in the memory controller 200 to sense the internal temperature of the memory controller 200. Since the internal temperature sensing unit 220 is disposed in the memory controller 200, the memory controller 200 may easily acquire internal temperature information through the internal temperature sensing unit 220 by controlling an internal signal rather than a separate communication interface.

The internal temperature sensing unit 220 may include sensors for detecting at least one piece of information in the same way as the external temperature sensing unit 140, and may include, for example, a temperature sensor for detecting temperature.

In an embodiment, the internal temperature sensing unit 220 may periodically sense the temperature of the memory controller 200 and may store the sensed temperature information in the memory controller 200.

Since the internal temperature sensing unit 220 is included in the memory controller 200 and the external temperature sensing unit 140 is disposed closer to the memory device 100, the memory controller 200 may easily and rapidly obtain the temperature information thereof from the internal temperature sensing unit 220 while accurately obtaining the temperature information of the memory device 100 from the external temperature sensing unit 140.

In accordance with an the present disclosure, the memory controller 200 may limit the operational performance of the storage device 50 using both internal temperature information provided from the internal temperature sensing unit 220 and external temperature information provided from the external temperature sensing unit 140.

A method by which the memory controller 200 performs the throttling operation according to an embodiment of the present disclosure will be described in detail later with reference to FIGS. 2 to 5.

The host interface 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

FIG. 2 is a block diagram illustrating an exemplary configuration of the performance adjustment unit 210 of FIG. 1.

Referring to FIG. 2, the performance adjustment unit 210 may include a correction value generation unit 211, a performance adjustment determination unit 212, and a correction value update control unit 213.

The correction value generation unit 211 may receive external temperature information Ex_T and internal temperature information In_T. The external temperature information Ex_T may indicate the temperature sensing result by the external temperature sensing unit 140 as described above with reference to FIG. 1. The internal temperature information may indicate the temperature sensing result by the internal temperature sensing unit 220 as described above with reference to FIG. 1. The correction value generation unit 211 may generate a correction value diff using, both the external temperature information Ex_T and the internal temperature information In_T. For example, the correction value generation unit 211 may generate a difference value between the external temperature information Ex_T and the internal temperature information In_T as the correction value diff. The correction value generation unit 211 may output the generated correction value diff to the performance adjustment determination unit 212.

In an embodiment, the correction value generation unit 211 may generate a correction value diff when external temperature information Ex_T and internal temperature information In_T are simultaneously inputted. Alternatively, when external temperature information Ex_T is inputted while internal temperature information In_T is continuously received, the correction value generation unit 211 may generate a correction value diff in response to the inputted external temperature information Ex_T. Alternatively, the correction value generation unit 211 may generate a correction value diff using both external temperature information Ex_T and internal temperature information In_T in response to a control signal (not illustrated) that is inputted through a separate line. Alternatively, the correction value generation unit 211 may generate a correction value diff in response to an update enable signal update_EN that is inputted from the correction value update control unit 213, which will be described later.

The performance adjustment determination unit 212 may determine whether to limit the operational performance of the storage device 50 depending on the temperature. For example, the performance adjustment determination unit 212 may output a throttling signal throttling_EN when the temperature of the memory device 100 is higher than a critical temperature.

The critical temperature may be a temperature at which the operation result of the memory device is unreliable. In an embodiment, the critical temperature may be a temperature that, cumulatively, affects the operating results of the memory device, even though it does not have an immediate effect on the memory device in itself. The critical temperature can be experimentally determined and stored in the memory controller.

In detail, the performance adjustment determination unit 212 may receive the internal temperature information In_T and the correction value diff. The performance adjustment determination unit 212 may generate adjusted temperature information in which the correction value diff is applied to the internal temperature information In_T. The performance adjustment determination unit 212 may compare the adjusted temperature information with pre-stored critical temperature information. When the adjusted temperature information is higher than the critical temperature information, the performance adjustment determination unit 212 may output the throttling signal throttling_EN.

In an embodiment, the performance adjustment determination unit 212 may determine whether to limit the operational performance of the storage device 50 depending on the temperature as described above with reference to FIG. 1 when a write request is inputted from a host 300. That is, the performance adjustment determination unit 212 may generate adjusted temperature information using both the internal temperature information In_T and the correction value diff when a write operation is performed, and may compare the adjusted temperature information with the critical temperature information.

The correction value update control unit 213 may output an update enable signal update_EN to the correction value generation unit 211 when a condition activation signal cond_EN indicating that a condition for updating the correction value diff has been satisfied is inputted. When the update enable signal update_EN is inputted from the correction value update control unit 213, the correction value generation unit 211 may generate a correction value diff using both the external temperature information Ex_T and the internal temperature information In_T.

The condition enable signal cond_EN may be inputted if the condition for updating the correction value is satisfied.

In an embodiment, the memory controller 200 may update the correction value diff depending on the number of erase-write operations (i.e., the number of erase-write cycles: EW cycles) of the memory device 100. For example, the memory controller 200 may enable the condition activation signal cond_EN that is an internal signal when the number of EW cycles of the memory device 100 exceeds a threshold number.

In an embodiment, the memory controller 200 may update the correction value diff whenever a preset reference time elapses. For example, whenever the preset reference time has elapsed, the memory controller 200 may enable the condition activation signal cond_EN that is an internal signal. In various embodiments, the preset reference time may be set based on the Quality of Service (QoS) criteria of the memory device 100.

In an embodiment, when the value of the internal temperature information In_T is changed to exceed a critical value, the memory controller 200 may update the correction value diff. For example, when the temperature sensing result by the internal temperature sensing unit 220, which is described above with reference to FIG. 1 is rapidly changed, that is, when the changed result is compared with a previously sensed result, and the changed temperature sensing result exceeds a critical value, the memory controller 200 may enable the condition activation signal cond_EN that is an internal signal.

Figure 3:
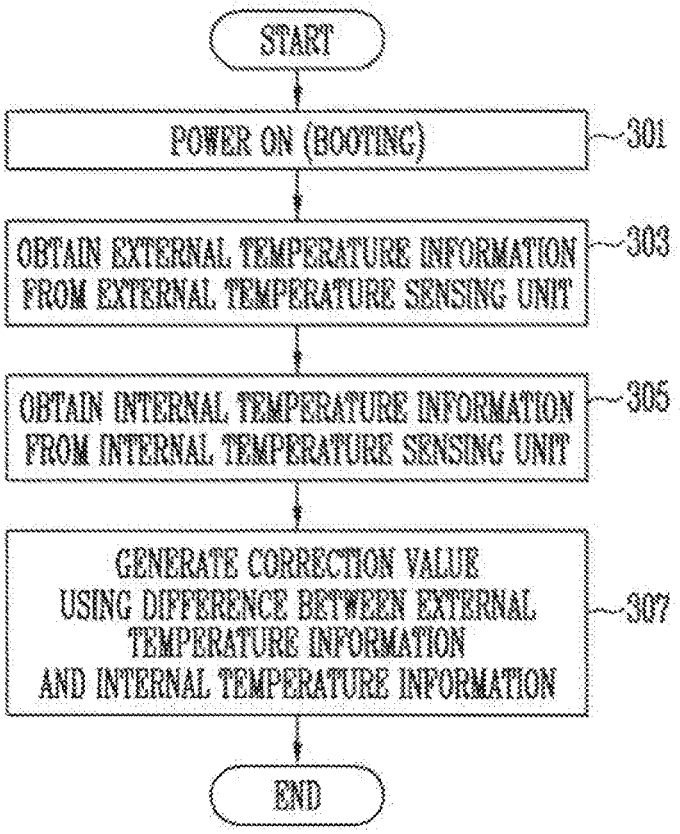
FIG. 3 is a flowchart illustrating an exemplary operation of a memory controller shown in FIG. 1.

FIG. 3 is a flowchart illustrating an exemplary operation of the memory controller 200. FIG. 3 illustrates an operation of the memory controller 200 generating a correction value diff when the storage device boots up and storing the generated correction value diff.

Referring to FIG. 3 at step 301, power is supplied to the storage device 50. When the power is supplied to the storage device 50, the memory controller 200 may perform a boot operation. The memory controller 200 may perform operations, which ill be described at steps 303 to 307, as the boot operation.

At step 303, the memory controller 200 may obtain the external temperature information that is the temperature sensing result by the external temperature sensing unit 140. In an embodiment, the temperature sensing result by the external temperature sensing unit 140 may be provided through a communication interface between the memory controller 200 and the memory device 100. For example, the memory controller 200 may obtain the external temperature information from the memory device 100 using a get parameter command.

At step 305, the memory controller 200 may obtain the internal temperature information from the internal temperature sensing unit 220. The internal temperature sensing unit 220 may be included in the memory controller 200. Therefore, the memory controller 200 may obtain the internal temperature information that is the temperature sensing result by the internal temperature sensing unit 220 in response to an internal control signal.

At step 307, the memory controller 200 may generate a correction value diff using a difference value between the external temperature information and the internal temperature information. The memory controller 200 may store the generated correction value diff.

Figure 4:
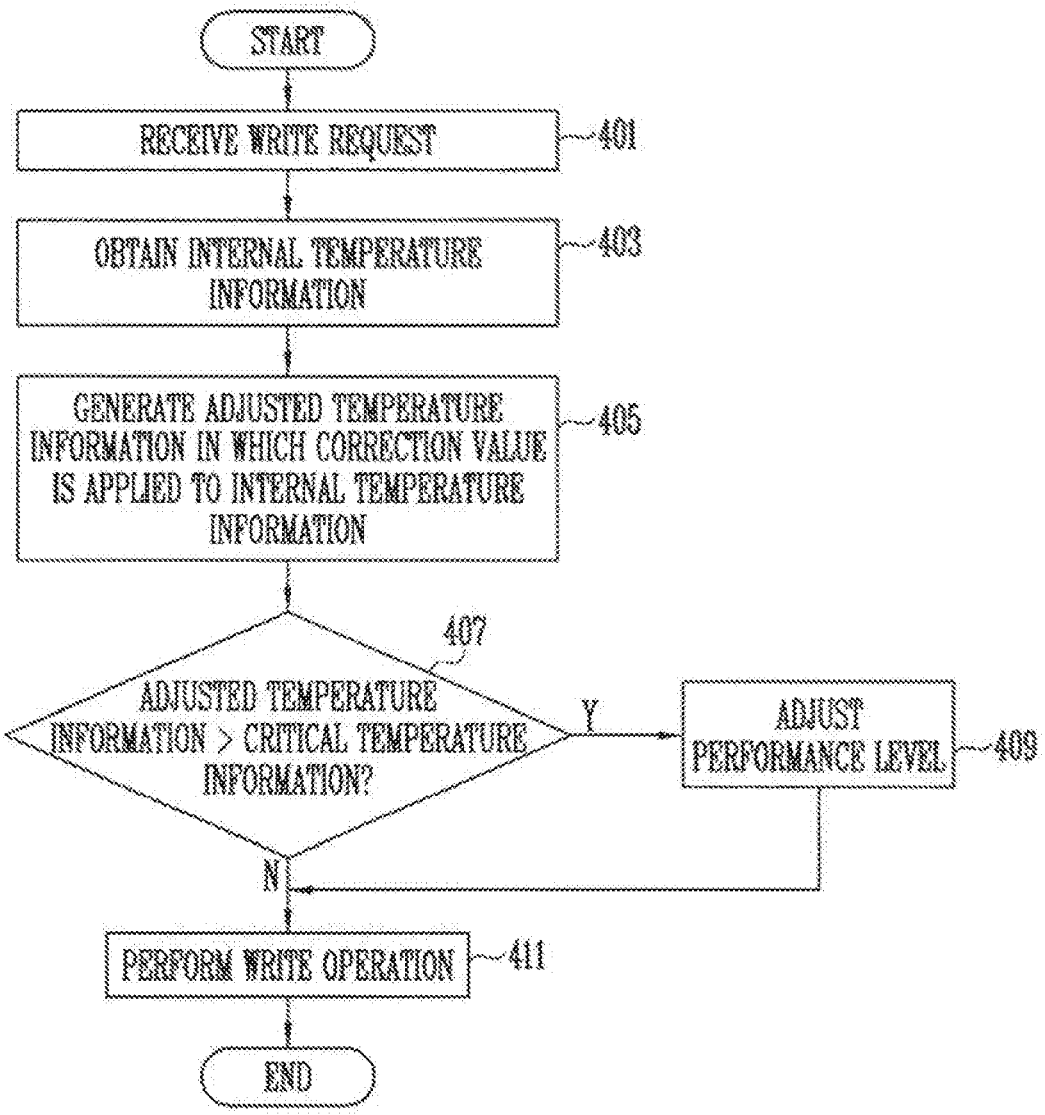
FIG. 4 is a flowchart for illustrating an exemplary operation of the memory controller shown in FIG. 1.

FIG. 4 is a flowchart illustrating an exemplary operation of the memory controller 200.

Referring, to FIG. 4, at step 401, the memory controller 200 may receive a write request from an external host 300. The memory controller 200 may determine whether to limit the operational performance of the storage device 50 depending on the temperature, in response to the write request received from the external host 300.

At step 403, the memory controller 200 may obtain the internal temperature information that is the temperature sensing result by the internal temperature sensing unit 220. Since the internal temperature sensing unit 220 is disposed in the memory controller 200, the memory controller 200 may obtain the internal temperature information in response to an internal control signal.

At step 405, the memory controller 200 may generate adjusted temperature information in which the correction value diff is applied to the internal temperature information. In detail, the correction value diff may be a value that is previously stored based on the operation described above with reference to FIG. 3. That is, the correction value diff may be a difference value between the external temperature information that is the temperature sensing result by the external temperature sensing unit 140 and the internal temperature information that is the temperature sensing result by the internal temperature sensing unit 220 when the storage device 50 boots. The memory controller 200 may generate the adjusted temperature information in which the correction value diff is applied to the internal temperature information, and may use the adjusted temperature information as temperature information of the memory device 100.

At step 407, the memory controller 200 may compare the adjusted temperature information with critical temperature information. The critical temperature information may indicate a temperature at which the memory controller 200 starts to control the performance of the storage device 50. For example, the memory controller 200 may control the performance of the storage device 50 when the temperature of the memory device 100 is higher than the critical temperature. If, as a result of the comparison at step 407, the adjusted temperature information is higher than the critical temperature information, the process proceeds to step 409, whereas if, as a result of the comparison at step 407, the adjusted temperature information is lower than or equal to the critical temperature information, the process proceeds to step 411.

At step 409, the memory controller 200 may adjust the performance level of the storage device 50. The memory controller 200 may control the performance of the storage device 50 by increasing or decreasing the performance level of the storage device 50. In detail, when the adjusted temperature information is higher than the critical temperature information, the temperature of the memory device 100 may be considered to be higher than the critical temperature, and the operation performance of the storage device 50 may be limited so as to decrease the temperature of the memory device 100. As described above an operation for limiting the performance of the storage device 50 is referred to as the throttling operation.

In an embodiment, when the temperature of the memory device 100 is higher than the critical temperature, the memory controller 200 may reduce data input/output speed.

In an embodiment, when the temperature of the memory device 100 is higher than the critical temperature, the memory controller 200 may decrease the number of memory devices 100 that are simultaneously accessed by the memory controller 200.

In an embodiment, when the temperature of the memory device 100 is higher than the critical temperature, the memory controller 200 may decrease the frequency of a timing signal or a dock signal that is inputted to the memory device 100 to a frequency lower than a basic frequency.

In an embodiment, when the temperature of the memory device 100 is higher than the critical temperature, the memory controller 200 may activate a cooler included in the storage device 50.

In addition to the above-described throttling operations, any operation of allowing the memory controller 200 to limit operational performance to decrease the temperature of the memory device 100 fails within the category of the throttling operation according to an embodiment of the present disclosure, and are not limited to the operations described in the present specification.

At step 411, the memory controller 200 may perform a write operation depending on the set performance level. In detail, when the adjusted temperature information is higher than the critical temperature information, the memory controller 200 may perform a write operation depending on the performance level adjusted at step 409, whereas when the adjusted temperature information is lower than or equal to the critical temperature information, the memory controller 200 may perform a write operation without adjusting the performance level.

In accordance with an embodiment of the present disclosure, the memory controller 200 may obtain the external temperature information at the boot time and may generate a correction value diff that is the difference value between the internal temperature information and the external temperature information. Thereafter, when a write operation is performed in response to a write request, the memory controller 200 may compare temperature information obtained by applying the correction value diff to the internal temperature information with the critical temperature information. Thus, even if the external temperature information is not obtained whenever a write operation is performed the memory controller 200 may perform a throttling operation corresponding to the temperature of the memory device 100.

Figure 5:
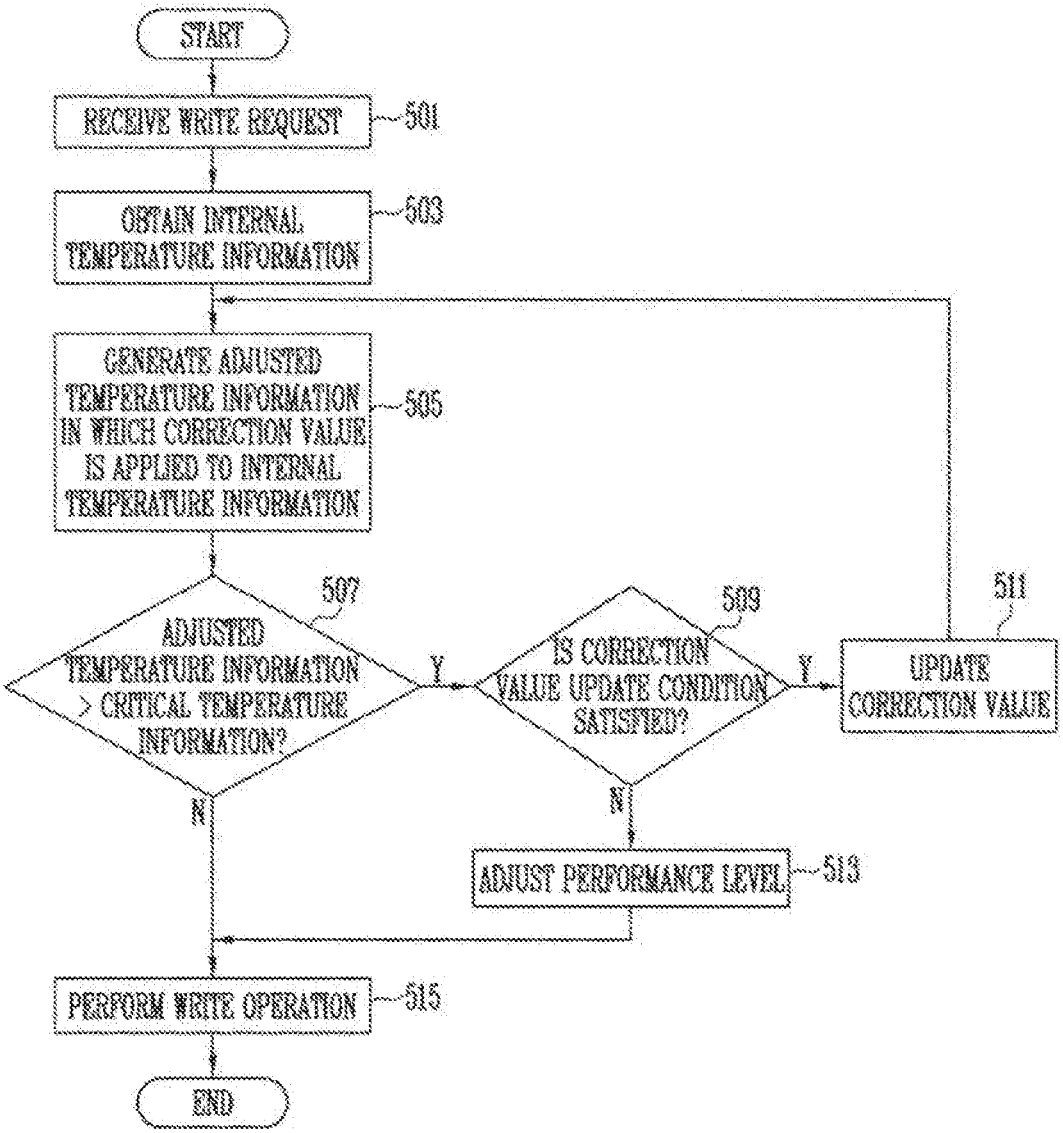
FIG. 5 is a flowchart for illustrating an exemplary operation of the memory controller shown in FIG. 1.

FIG. 5 is a flowchart illustrating an exemplary operation of the memory controller 200. FIG. 5 illustrates the memory controller 200 updating a correction value diff generated at the boot time.

Referring to FIG. 5, at step 501, the memory controller 200 may receive a write request from an external host 300. The memory controller 200 may determine whether to limit the performance of the storage device 50 depending on the temperature, in response to the write request received from the external host 300.

At step 503, the memory controller 200 may obtain the internal temperature information that is the temperature sensing result by the internal temperature sensing unit 220. Since the internal temperature sensing unit 220 is disposed in the memory controller 200, the memory controller 200 may obtain the internal temperature information in response to an internal control signal.

At step 505, the memory controller 200 may generate adjusted temperature information in which the correction value diff is applied to the internal temperature information. In detail, the correction value diff may be a value that is previously stored based on the operation described above with reference to FIG. That is, the correction value diff may be a difference value between the external temperature information that is the temperature sensing result by the external temperature sensing unit 140 and the internal temperature information that is the temperature sensing result by the internal temperature sensing unit 220 when the storage device 50 boots. The memory controller 200 may generate the adjusted temperature information in which the correction value diff is applied to the internal temperature information, and may use the adjusted temperature information as temperature information of the memory device 100.

At step 507, the memory controller 200 may compare the adjusted temperature information with critical temperature information. The critical temperature information may indicate a temperature at which the memory controller 200 starts to control the performance of the storage device 50. For example, the memory controller 200 may control the performance of the storage device 50 when the temperature of the memory device 100 is higher than the critical temperature. If, as a result of the comparison at step 507, the adjusted temperature information is higher than the critical temperature information, the process proceeds to step 509, whereas if, as a result of the comparison at step 507, the adjusted temperature information is lower than or equal to the critical temperature information, the process proceeds to step 515.

At step 509, the memory controller 200 may determine whether a correction value update condition is satisfied. The correction value diff may be generated depending on the embodiment as described above with reference to FIG. 3 at the boot time, but the difference value between the external temperature information that is the temperature sensing result by the external temperature sensing unit 140 and the internal temperature information that is the temperature sensing result by the internal temperature sensing unit 220 may change with the passage of time. Therefore, in order to perform a precise throttling operation depending on the temperature, there is a need to update the correction value diff. However, when the correction value diff is generated whenever a write operation is performed, the performance of the storage device 50 may be deteriorated, and thus the memory controller 200 may update the correction value diff only when the correction value update condition is satisfied.

In an embodiment, the memory controller 200 may update the correction value diff based on the number of erase-write cycles (EW cycles) of the memory device 100. For example, the memory controller 200 may determine that the correction value update condition is satisfied when the number of EW cycles exceeds a threshold number.

In an embodiment, the memory controller 200 may update the correction value diff whenever a preset reference time has elapsed. For example, whenever the preset reference time has elapsed, the memory controller 200 may determine that the correction value update condition is satisfied. In various embodiments, the preset reference time may be set based on the Quality of Service (QoS) criteria of the memory device.

In an embodiment, when the value of the internal temperature information is changed to exceed a critical value, the memory controller 200 may update the correction value diff. For example, when the temperature sensing result by the internal temperature sensing unit 220, which is described above with reference to FIG. 1, is rapidly changed, that is, when the changed result is compared with a previously sensed result, and the changed temperature sensing result is changed to exceed the critical value, the memory controller may determine that the correction value update condition is satisfied.

As a result of the determination at step 509, if the correction value update condition is satisfied, the process proceeds to step 511, whereas if the correction value update condition is not satisfied, the process proceeds to step 513.

At step 511, the memory controller 200 may update the correction value diff In detail, the memory controller 200 may update the correction value diff based on steps 303 to 307 as described above with reference to FIG. 3. After the correction value diff has been updated, the memory controller 200 may return to step 505 where adjusted temperature information may be generated using the updated correction value diff.

At step 13, the memory controller 200 may adjust the performance level of the storage device 50. The memory controller 200 may control the performance of the storage device 50 by increasing or decreasing the performance level of the storage device 50. In detail, when the adjusted temperature information is higher than the critical temperature information, the temperature of the memory device 100 may be considered to be higher than the critical temperature, and the operation performance of the storage device 50 may be limited so as to decrease the temperature of the memory device 100. As described above, an operation for limiting the performance of the storage device 50 is referred to as the throttling operation.

In an embodiment, when the temperature of the memory device 100 is higher than the critical temperature, the memory controller 200 may reduce data input/output speed.

In an embodiment, when the temperature of the memory device 100 is higher than the critical temperature, the memory controller 200 may decrease the number of memory devices 100 that are simultaneously accessed by the memory controller 200.

In an embodiment, when the temperature of the memory device 100 is higher than the critical temperature, the memory controller 200 may decrease the frequency of a timing signal or a clock signal that is inputted to the memory device 100 to a frequency lower than a basic frequency.

In an embodiment, when the temperature of the memory device 100 is higher than the critical temperature, the memory controller 200 may activate a cooler included in the storage device 50.

In addition to the above-described throttling operations, any operation of allowing the memory controller 200 to limit operational performance to decrease the temperature of the memory device 100 falls within the category of the throttling operation according to an embodiment of the present disclosure, and are not limited to the operations described in the present specification.

At step 515, the memory controller 200 may perform a write operation depending on the set performance level. In detail, when the adjusted temperature information is higher than the critical temperature information and the correction value update condition is not satisfied, the memory controller 200 may perform a write operation depending on the performance level adjusted at step 513, whereas when the adjusted temperature information is lower than or equal to the critical temperature information, the memory controller 200 may perform a write operation without adjusting the performance level.

FIG. 6 is a diagram illustrating an exemplary configuration of the memory device 100 of FIG. 1.

Referring to FIG. 6, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. As the dummy cells, one or more dummy cells may be coupled in series between a drain select transistor and the memory cells and between a source select transistor and the memory cells.

The memory cells of the memory device 100 may each be implemented as a single-level cell (SLC) capable of storing a single data bit or a multi-level cell (MLC) capable of storing two or more data bits, including, for example, a triple-level cell (TLC) capable of storing three data bits, or a quad-level cell (QLC) capable of storing four data bits.

The peripheral circuit 120 may include an address decoder 121, a voltage generator 122, the read and write circuit 123, a data input/output circuit 124, and an external temperature sensing unit 125.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines L. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to be operated under the control of the control logic 130. The address decoder 121 receives the address ADDR from the control logic 130.

The address decoder 121 is configured to decode a block address of the received address ADDR. The address decoder 121 selects at least one memory block from among the memory blocks BLK1 to BLKz in response to the decoded block address. The address decoder 121 is configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verification pass voltage higher than the verify voltage to unselected word lines.

During a read operation, the address decoder 121 may apply a read voltage to a selected word line and apply a pass voltage higher than the read voltage to unselected word lines.

In an embodiment, the erase operation of the memory device 10 may be performed on a memory block basis. During an erase operation, the address ADDR input to the memory device 100 includes a block address. The address decoder 121 may decode the block address and select a single memory block in response to the decoded block address. During the erase operation, the address decoder 121 may apply a ground voltage to word lines coupled to the selected memory block.

In an embodiment, the address decoder 121 may be configured to decode a column address of the received address ADDR. A decoded column address DCA may be transferred to the read and write circuit 123. In an exemplary embodiment, the address decoder 121 may include components such as a row decoder, a column decoder, and an address buffer.

The voltage generator 122 is configured to generate a plurality of voltages using, an external supply voltage provided to the memory device 1000. The voltage generator 122 is operated under the control of the control logic 130.

In an embodiment, the voltage generator 122 may generate an internal supply voltage by regulating the external supply voltage. Phe internal supply voltage generated by the voltage generator 122 is used as an operating voltage of the memory device 100.

In an embodiment, the voltage generator 122 may generate a plurality of voltages using an external supply voltage or an internal supply voltage. The voltage generator 122 may be configured to generate various voltages required by the memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage and may generate a plurality of voltages by selectively activating the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data DATA, received through the data input/output circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers read page data from the selected memory cells through the bit lines BL1 to BLm.

During a read operation, the read and write circuit 123 reads data DATA from the memory cells in the selected page through the bit lines BL, and outputs the read data DATA to the data input/output circuit 124.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) for receiving input data. During a program operation, the data input/output circuit 124 receives data to be stored DATA from an external controller (not shown). During a read operation, the data input/output circuit 124 outputs the data, received from the first to m-th page buffers PB1 to PBm included in the read and write circuit 123, to the external controller.

The external temperature sensing unit 123 may be the external temperature sensing unit 140 as described above with reference to FIGS. 1 to 5. The external temperature sensing unit 125 may sense the temperature of the memory device 100 and provide the sensing result to the control logic 130. The external temperature sensing unit 125 may include at least one sensor for detecting at least one piece of information, and may include, for example, a temperature sensor for detecting temperature. The types of temperature sensors included in the external temperature sensing unit 125 are not limited by embodiments of the present disclosure. For example, examples of the temperature sensors may include a resistance temperature detector (RTD), a thermistor, etc. The RTD may be a temperature sensor that uses a metal material having high variation in resistance depending on the temperature, for example, platinum (Pt), and detects the temperature by measuring the variation in the resistance of the metal material. The thermistor is a semiconductor element obtained by mixing and sintering oxides such as manganese, nickel, copper, cobalt, chrome, and iron oxides, and has a characteristic that variation in resistance is large for a small temperature change. Such a thermistor may be manufactured and used in various forms. For example, the thermistor may be manufactured in the form of a chip in which electrodes are formed on both sides.

The control logic 130 may be coupled t the address decoder 121, the voltage generator 122, the read and write circuit 123, the data input/output circuit 124, and the external temperature sensing unit 125. The control logic 130 may control the overall operation of the memory device 100. The control logic 130 may be operated in response to a command CMD received from an external device. In an embodiment, the control logic 130 may provide external temperature information that is the temperature sensing result by the external temperature sensing unit 125 to an external controller in response to the command from the external controller.

FIG. 7 is a diagram illustrating an embodiment of the memory cell array of FIG. 6.

Referring to FIG. 7, the memory cell array 110 includes a plurality of memory blocks BLK1 to BLKz. Each memory block has a three-dimensional (3D) structure. Each memory block includes a plurality of memory cells stacked on a substrate. Such memory cells are arranged along a positive X (+X) direction, a positive Y (+Y) direction, and a positive Z (+Z) direction. An exemplary configuration of each memory block will be described in detail below with reference to FIGS. 8 and 9.

FIG. 8 is an exemplary circuit diagram illustrating any one (BLK1) of the memory blocks BLK1 to BLKz of FIG. 7.

Referring to FIG. 8, the first memory block BLK1 includes a plurality of cell strings CS11 to CS1m and CS21 to CS2m. In an embodiment each of the cell strings CS11 to CS1m and CS21 to CS2m may be formed in a 'U' shape. In the first memory block BLK1, m cell strings are arranged in a row direction (i.e. a positive (+) X direction). In FIG. 8, two cell strings are shown as being arranged in a column direction (i.e. a positive (+) y direction). However, this illustration is made for convenience of description and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 8 source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor P and the drain select transistor DST. The first to path memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extended in a column direction. In FIG. 8, cell strings CS11 and CS21 in a first column are coupled to a first bit line BL1. Cell strings CS1m and CS2m in an m-th column are coupled to an m-th bit, line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLK1 is improved, but the size of the memory block BLK1 is increased. As fewer memory cells are provided, the size of the memory block BLK1 is reduced, but the reliability of the operation of the memory block. BLK1 may be deteriorated.

In order to efficiently control the one or more dummy memory cells, each of the dummy memory cells may have a required threshold voltage. Before or after the erase operation of the memory block BLK1 is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

FIG. 9 is an exemplary circuit diagram illustrating an embodiment BLK1' of any one (BLK1) of the memory blocks BLK1 to BLKz of FIG. 7.

Referring to FIG. 9, a first memory block BLK1 includes a plurality of cell strings CS11' to CS1m' and CS21' to CS2m'. Each of the plurality of cell strings CS11' to CS1m' and CS21 to CS2m' is extended along a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLK1'.

The source select transistor SST of each cell string connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21 to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLK1' of FIG. 9 has an equivalent circuit similar to that of the memory block BLK1 of FIG. 8 except that a pipe transistor PT is excluded from each cell string.

In an embodiment, even bit lines and odd bit lines, instead of first to m-th bit lines BL1 to BLm may be provided. Further, even-numbered cell strings, among the cell strings CS11" to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLK1' is improved, but the size of the memory block BLK1' is increased. As fewer memory cells are provided, the size of the memory block BLK1' is reduced, but the reliability of the operation of the memory block BLK1' may be deteriorated.

In order to efficiently control the one or more dummy memory cells, each of the dummy memory cells may have a required threshold voltage. Before or after the erase operation of the memory block BLK1' is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

FIG. 10 is a diagram illustrating an embodiment of the memory controller of FIG. 1.

A memory controller 1000 is coupled to a host and a memory device. In response to a request from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 10, the memory controller 1000 may include a processor 1010, a memory buffer 1020, an error correction code (ECC) block 1030, a host interface 1040, a buffer control circuit 1050, a memory interface 1060, and a bus 1070. The memory controller may also include a performance adjustment unit 210 and an internal temperature sensing unit 220 as in the embodiment of FIG. 1. The memory controller 2100 may be implemented in the same way as the memory controller 200, described above with reference to FIG. 1.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processing unit 1010 may use a randomizing seed to randomize data received from the host. The randomized data may be provided, as data to be stored, to the memory device and may be programmed in the memory cell array.

The processor may derandomize data received from the memory device during a read operation. For example the processor 1010 may derandomize the data received from the memory device using a derandomizing seed. The derandomized data may be outputted to the host.

In an embodiment, the processor 1010 may run software or firmware to perform randomizing and derandomizing operations.

In an embodiment, the processor 1010 may perform the operation of the performance adjustment unit 210, described above with reference to FIGS. 1 and 2. For example, the processor 1010 may run firmware for adjusting the performance of the storage device depending on the temperature of the memory device. The firmware for adjusting the performance of the storage device depending on the temperature may run based on the operating method of the memory controller, described above with reference to FIGS. 2 to 5.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. In an example, the ECC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g. ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

FIG. 11 is a block diagram illustrating a memory card system, to which the storage device according to an embodiment of the present disclosure is applied.

Referring to FIG. 11, a memory card system 2000 may include a memory controller 2100, a memory device 2200, and connector 2300.

The memory controller 2100 is coupled to the memory device 2200. The memory controller 2100 may access the memory device 2200. For example the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200, described above with reference to FIG. 1.

In an embodiment, the memory controller 2100 may include components, such as a RAM, a processing unit, a host interface, a memory interface, and an ECC block.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The operation of controlling the performance of the storage device depending on the temperature of the memory device, described above with reference to FIGS. 1 to 5, may be performed by the memory controller 2100. In this case, the external temperature sensing unit 140, described above with reference to FIG. 1 may be disposed in the memory device 2200. Alternatively, although not illustrated in the drawing the external temperature sensing unit 140 may be implemented on the memory card system 2000, independently of the memory controller 2100 and the memory device 2200.

In an embodiment, the memory controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP). Thin Small Outline (TSOP), System In Package (SIP), Multi Chip Package (MCP), Wafer-level Fabricated Package (WFP), Wafer-Level Processed Stack Package (WSP), or the like and may be provided as a single semiconductor package. Alternatively, the memory device 2200 may include a plurality of nonvolatile memory chips, which may be packaged based on the above-described package types and may be provided as a single semiconductor package.

In an embodiment, the memory controller 2100 and the memory device 2200 may be integrated into a single semiconductor device. In an embodiment, the memory controller 2100 and the memory device 2200 may be integrated into a single semiconductor device to configure a solid state drive (SSD). The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

In an embodiment, the memory device 2200 may be the memory device 100, described above with reference to FIGS. 1 and 6 to 9. That is, the memory device 2200 may, be operated based on the throttling operation, described above with reference to FIGS. 1 to 5.

FIG. 12 is a block diagram illustrating an example of a solid state drive (SSD) system to which the storage device according to an embodiment of the present disclosure is applied.

Referring FIG. 12 an SSD system 3000 may include a host 3100 and an SSD 3200. Phe SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE). Firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store met data (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

In an embodiment, the nonvolatile memories 3221 to 322n may be the nonvolatile memory devices, described above with reference to FIGS. 1 to 11. That is, the nonvolatile memories 3221 to 322n may erase memory blocks based on the erase method, described above with reference to FIGS. 1 to 11.

In an embodiment, the memory devices 3221 to 322n may be the memory device 100, described above with reference to FIGS. 1 and 6 to 9. That is, the memory devices 3221 to 322n may be operated based on the throttling operation, described above with reference to FIGS. 1 to 5.

FIG. 13 is a block diagram illustrating a user system to which the storage device according to an embodiment of the present disclosure is applied.

Referring to FIG. 13, a user system 4000 may include an application processor 3100, a memory module 4200, a network module 4300, a storage module 4400, and a user interface 4500.

The application processor 4100 may run components included in the user system 4000, an Operating System (OS) or a user program. In an embodiment the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR3 SDRAM, and LPDDR3 SDRAM or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 400.

In an embodiment, the storage module 4400 may include a plurality of nonvolatile memory devices, which may each be the memory device 100, described above with reference to FIGS. 1 and 6 to 9. That is, the nonvolatile memory device included in the storage module 4400 may be operated based on the throttling operation, described above with reference to FIGS. 1 to 5.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLEO (AMOLED) display device, an LED, a speaker, and a motor.

In accordance with the present disclosure, there are provided a storage device that controls the performance thereof depending on the temperature and a method of operating the storage device.

While the exemplary embodiments of the present disclosure have been disclosed for illustrative purposes, those skilled in the art will appreciate that various modifications, additions and substitutions are possible. Therefore, the scope of the present disclosure must be defined by the accompanying claims and equivalents thereof rather than by the above-described embodiments.

Although the embodiments of the present disclosure have been disclosed, those skilled in the art will appreciate that various modifications additions and substitutions are possible, without departing from the scope and spirit of the present disclosure.

In the above-discussed embodiments, all steps may be selectively performed or skipped. In addition, the steps in each embodiment may not always performed in regular order. Furthermore, the embodiments disclosed in the present specification and the drawings aims to help those with ordinary knowledge in this art more clearly understand the present disclosure rather than aiming to limit the bounds of the present disclosure. In other words one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A memory controller for controlling a memory device, the memory controller comprising:

[an internal temperature sensor configured to generate an internal temperature information by sensing a temperature of the memory controller; and]

a performance adjuster configured to receive an external temperature information from an external temperature sensing unit, and controlling [operational performance] *a data input/output speed* of the memory controller using [the] *an* internal temperature information and the external temperature information, wherein the external temperature information represents a temperature of the memory device, *and* wherein the performance adjuster comprises:

*a* correction value generator configured to generate a correction value based on the internal and external temperature information;

a performance adjustment determination circuit configured to generate an adjusted temperature information, in which the correction value is applied to the internal temperature information, to compare the adjusted temperature information with pre-stored critical temperature information and then to determine whether to adjust the [operational performance] *data input/output speed* of the memory controller based on a result of the [comparing] *comparison*; and a correction value update controller configured to generate an update enable signal for updating the correction value, and to output the update enable signal when a number of erase-write cycles (EW cycles) of the memory device exceeds a threshold number.

2. The memory controller according to claim 1, wherein the correction value generator generates the correction value when power is supplied to the memory controller.

3. The memory controller according to claim 1, wherein the correction value is a difference value between the internal temperature information and the external temperature information.

4. The memory controller according to claim 1, wherein the performance [adjustment determination circuit] *adjuster* controls the [operational performance] *data input/output speed* by outputting a throttling signal for activating a throttling operation that adjusts the [operational performance] *data input/output speed* of the memory controller when a write request for the memory device is inputted and the adjusted temperature information is higher than the critical temperature information.

5. The memory controller according to claim 4, wherein the throttling operation is an operation of decreasing [a] *the* data input/output speed of the memory controller.

6. The memory controller according to claim 4, wherein:

the memory controller is capable of simultaneously accessing a plurality of memory devices, and the throttling operation is an operation of decreasing a number of memory devices that the memory controller simultaneously accesses.

7. The memory controller according to claim 4, wherein the throttling operation is an operation of decreasing a frequency of a timing signal or a clock signal that is inputted to the memory device.

8. The memory controller according to claim 4, wherein the [throttling operation is an operation of activating] *performance adjuster activates* a cooler disposed outside the memory controller *while the throttling operation is activated*.

9. The memory controller according to claim 1, wherein the correction value update controller outputs the update enable signal when the internal temperature information [is changed] *changes* to exceed a critical value.

10. The memory controller according to claim 1, wherein the correction value update controller outputs the update enable signal when a preset reference time has elapsed.

11. The memory controller according to claim 10, wherein the preset reference time is set based on Quality of Service (QoS) criteria of the memory device.

12. A storage device comprising:

a plurality of memory devices; *and*

[an external temperature sensor configured to generate an external temperature information by sensing a temperature of the respective memory device; and]

a memory controller configured to:

control the plurality of memory devices, and control [operational performance] *a data input/output speed* of the memory controller using *an* internal temperature information and the external temperature information, wherein the internal temperature information represents a temperature of the memory controller,

[wherein the memory controller is configured to]

generate a correction value representing a difference value between the internal temperature information and the external temperature information,

[to]generate *an* adjusted temperature information in which the correction value is applied to the internal temperature information[and],

[to updating]*update* the correction value when a number of erase-write cycles (EW cycles) of the memory device exceeds a threshold number*, and*

*determine whether to adjust the data input/output speed of the memory controller based on the adjusted temperature information*.

13. The storage device according to claim 12, wherein the memory controller [is configured to generate] *generates* the correction value *representing a difference value between the internal temperature information and the external temperature information* when the storage device boots, and [wherein] *generates* the adjusted temperature information [is generated] *in which the correction value is applied to the internal temperature information* at a time at which a write request for the plurality of memory devices is inputted.

14. The storage device according to claim 13, wherein the memory controller is configured to control [operational performance] *the data input/output speed* by comparing the adjusted temperature information with *a* pre-stored critical temperature information.

15. A method of operating a storage device, the storage device including a plurality of memory devices and a memory controller for controlling the memory devices, the method comprising:

obtaining, when a write request for the plurality of memory devices is inputted, internal temperature information representing a temperature of the memory controller;

generating, when the storage device boots, a correction value based on the internal temperature information and an external temperature information representing a temperature of the respective memory devices;

generating *an* adjusted temperature information by applying the correction value to the internal temperature information;

adjusting [operational performance] *a data input/output speed* of the memory controller using the adjusted temperature information and *a* pre-stored critical temperature information; and updating the correction value in response to an update enable signal which is generated when a number of erase-write cycles (EW cycles) of the memory device exceeds a threshold number.

16. The method according to claim 15, wherein the [operational performance] *data input/output speed* is adjusted when the adjusted temperature information exceeds the critical temperature information.

17. The method according to claim 15, further comprising generating an update enable signal when the internal temperature information [is changed] *changes* to exceed a critical value.

* * * * *